(12) United States Patent
Ho

(10) Patent No.: US 7,507,897 B2
(45) Date of Patent: Mar. 24, 2009

(54) DICTIONARY-BASED COMPRESSION OF MELODY DATA AND COMPRESSOR/DECOMPRESSOR FOR THE SAME

(75) Inventor: Yu Fan Ho, New Territories (HK)

(73) Assignee: VTech Telecommunications Limited, Tai Po, New Territory (HK)

(*) Notice: Subject to any disclaimer, the term of this patent is extended or adjusted under 35 U.S.C. 154(b) by 0 days.

(21) Appl. No.: 11/645,574

(22) Filed: Dec. 27, 2006

(65) Prior Publication Data

US 2007/0152853 A1    Jul. 5, 2007

Related U.S. Application Data

(60) Provisional application No. 60/754,622, filed on Dec. 30, 2005.

(51) Int. Cl.
    G10H 7/00    (2006.01)
    A63H 5/00    (2006.01)
    G04B 13/00   (2006.01)

(52) U.S. Cl. ...................................................... 84/609

(58) Field of Classification Search ............... 84/609, 84/645
    See application file for complete search history.

(56) References Cited

U.S. PATENT DOCUMENTS

| | | | |
|---|---|---|---|
| 5,532,694 A * | 7/1996 | Mayers et al. | 341/67 |
| 5,673,042 A * | 9/1997 | Yoshida et al. | 341/51 |
| 5,869,782 A | 2/1999 | Shishido et al. | |
| 6,075,470 A * | 6/2000 | Little et al. | 341/107 |
| 6,247,015 B1 * | 6/2001 | Baumgartner et al. | 707/101 |
| 6,476,307 B2 | 11/2002 | Hikawa | |
| 6,525,256 B2 | 2/2003 | Boudet et al. | |
| 6,535,642 B1 | 3/2003 | De Bonet | |

OTHER PUBLICATIONS

"A Statistical Lempel-Ziv Compression Algorithm for Personal Digital Assistant (PDA)" by S. Kwong and Y.F. Ho; IEEE Transactions on Consumer Electronics, vol. 47, No. 1, pp. 154-162, Feb. 2001.
"Modeling For Text Compression", by Timothy Bell, Ian H. Witten and John G. Cleary, ACM Computing Surveys, vol. 21, No. 4, pp. 557-591, Dec. 1989.
German Office Action with English Translation; dated Nov. 11, 2008.

* cited by examiner

Primary Examiner—Jeffrey Donels
(74) Attorney, Agent, or Firm—Paul, Hastings, Janofsky & Walker LLP

(57) ABSTRACT

A data format for a dictionary-based compressed melody data includes a command part and a data part. The command part includes an index for designating an indexed dictionary entry in a dictionary and indicators for indicating modification/update options for the dictionary. The data part is used to modify the indexed dictionary entry to obtain a decoded musical note. A compressor selects a musical note as a dictionary entry according to a statistical model and records an index in the command part. The compressor further stores a difference between a musical note and an existing dictionary entry in the data part. A decompressor reads an indexed dictionary entry from a dictionary thereof and selectively modifies the indexed dictionary entry by the data part in the compressed data. The decompressor optionally updates the dictionary thereof by the decoded musical note. Therefore, the dictionaries of the compressor and the decompressor can be synchronized.

26 Claims, 7 Drawing Sheets

| Melody | Original size | LZ77 | Power Archiver 6.11 | SLZ (W=4) | SLZ (W=8) | SLZ (W=16) |
|---|---|---|---|---|---|---|
| 1 | 256 | 185 | 183 | 181 | 170 | 169 |
| 2 | 500 | 219 | 171 | 211 | 183 | 163 |
| 3 | 544 | 264 | 182 | 261 | 219 | 186 |
| 4 | 16 | 14 | 16 | 12 | 13 | 13 |
| 5 | 308 | 227 | 200 | 236 | 214 | 195 |
| 6 | 272 | 114 | 116 | 151 | 125 | 114 |
| 7 | 352 | 182 | 183 | 175 | 156 | 157 |
| 8 | 508 | 237 | 210 | 272 | 230 | 212 |
| 9 | 444 | 266 | 230 | 263 | 240 | 232 |
| 10 | 704 | 347 | 264 | 363 | 307 | 256 |
| 11 | 516 | 215 | 204 | 234 | 202 | 188 |
| 12 | 152 | 32 | 14 | 23 | 28 | 33 |
| Total | 4572 | 2302 | 1973 | 2382 | 2087 | 1918 |

FIG. 6

DICTIONARY-BASED COMPRESSION OF MELODY DATA AND COMPRESSOR/DECOMPRESSOR FOR THE SAME

The present application claims the benefit of U.S. Provisional Application 60/754,622 filed, Dec. 30, 2005, which is hereby incorporated by reference herein in its entirety.

BACKGROUND

1. Field of the Invention

The present invention relates generally to a compression method and format of digital data and, more particularly, to a compression method and format of melody data by dictionary coding.

2. Background of the Invention

Existing hand-held communication devices, such as mobile phones and cordless phones, can generally play melody ring tones to announce incoming calls. The melody data may be either pre-stored in the hand-held device or downloaded from a service provider. An efficient compression scheme for the melody data is essential to lower the cost of memory device for storing the melodies or to save bandwidth requirement for downloading the melodies over a band limited channel.

Lossy compression algorithms for compressing sophisticated melody data, like MIDI, have been developed. For example, U.S. Pat. No. 6,525,256 discloses a method of compressing a MIDI file. There is room to further compress the data by lossless schemes. LZ-based compression schemes based on the algorithm presented by Ziv & Lempel in 1977 (LZ77) are widely used for compressing melody data because of its remarkable compression ratio and low complexity of the decompressor. U.S. Pat. Nos. 5,869,782 and 6,476,307 disclose LZ-based compression schemes. LZ77 takes advantage of the repetitive characteristic of the data. The decompression process can be done simply by copying the repeated data from the search window according to an index in the compressed data. Data that is not found in the window is left uncompressed in the compressed data. The decompressed data is then shifted into the search window for the next repetition, and so on. The data is shifted into the window unconditionally without considering the statistical information. Because of limited size of the search window, the first-in data is shifted out unconditionally when the window is full. There are high possibilities that the window is occupied by the useless (non-repetitive) data while the useful (to be repeated) data is banished. To improve the compression ratio, a larger search window should be used and hence more memory would be required by the decompressor.

In 2001, Kwong & Ho presented a concept of statistical Lempel Ziv (SLZ) in *IEEE Transactions on Consumer Electronics*, Vol. 47, Issue 1, pp. 154-162, February 2001. It is an LZ-like lossless compression algorithm, but statistical information is also taken into consideration to identify the useful data that should be put into the dictionary (search window). It improves the compression ratio compared with LZ77 because more useful data can be kept in the dictionary.

The dictionary can be smaller in size for keeping the useful data and hence less memory is required by the decompressor. Since not all the data has to be shifted into the window, less processing power is required on the decompressor. However, SLZ is a scheme designed for compressing universal data. Kwong & Ho did not teach an efficient method to maintain the dictionary in which the data was in variable lengths. This is a barrier for SLZ to be a practical universal compression scheme.

If the data to be compressed were in form of records in a fixed length, the dictionary is reduced to be a simple first-in-first-out sliding window. Implementation of SLZ becomes practical and all the advantages of SLZ are realized. Melody data is represented by a sequence of musical notes. Each note is represented by a fixed number of bytes that consist of the information of starting time of the note, note duration, note frequency, note velocity, musical instrument playing the note, etc. The inherent characteristics of melody data make SLZ be a suitable scheme for compressing melody data.

SUMMARY

In an embodiment of the present invention, a data compressor for compressing a melody data to a compressed data comprises command-data generator, a dictionary having a first plurality of dictionary entries, a sliding window used to gather a plurality of input musical notes in the melody data, a statistical model for the melody data, and a switch selectively placing an input musical note into the dictionary when the musical note has a significance according to the statistical model.

In an embodiment of the present invention, a dictionary-based method for compressing a melody data into a compressed data having a command part and a data part, the method comprises selecting a plurality of musical notes from the melody data, placing a musical note in a dictionary as a dictionary entry when the musical note has statistical significance, and storing an index for the dictionary entry in the command part.

In another embodiment of the present invention, a data decompressor for decompressing compressed data into melody data, wherein the compressed data comprises an index for designating an indexed dictionary entry in a dictionary, a first indicator for indicating whether modification of the indexed dictionary entry is required, a second indicator for indicating whether an update of the dictionary is required, a data part for modifying the indexed dictionary entry, the data decompressor comprises a dictionary with a first plurality of dictionary entries, and a decoder configured to select the indexed dictionary entry from the dictionary according to the index in the compressed data.

In another embodiment of the present invention, a data decompressing method for decompressing compressed data into melody data, wherein the compressed data comprises an index for designating an indexed dictionary entry in a dictionary, a first indicator for indicating a modification of indexed dictionary entry, a second indicator for indicating an update of the dictionary, a data part for modifying the indexed dictionary entry, the data decompressing method comprises reading compressed data, finding an indexed dictionary entry in the dictionary according to the index, and using the indexed dictionary entry as a decoded musical note when the first indicator indicates that no modification is needed.

In another embodiment of the present invention, a data format for a dictionary-based compressed melody data, comprises a command part comprising an index to designate an indexed dictionary entry in a dictionary and a first indicator that is configured to specify an operation to be performed on the indexed dictionary entry.

BRIEF DESCRIPTION OF THE DRAWINGS

FIG. 6 shows an exemplary table that evaluates the performance of the present invention.

DETAILED DESCRIPTION OF THE INVENTION

Figure 1:
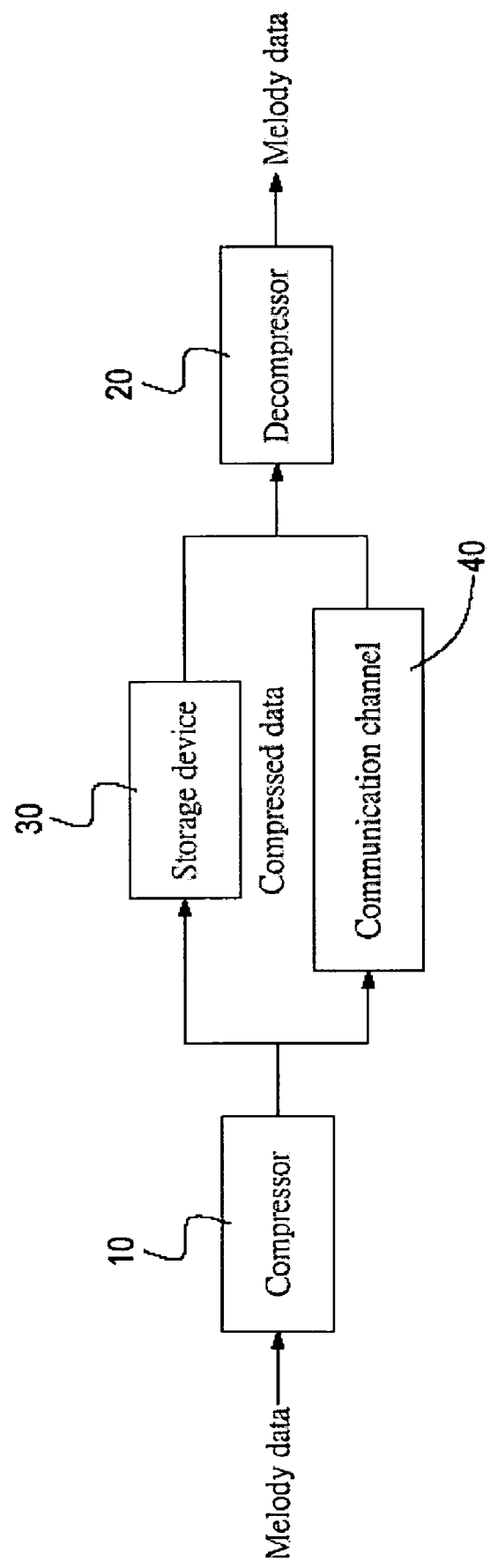
FIG. 1 shows compressor and decompressor pair according to a preferred embodiment of the present invention.

The preferred embodiment of the present invention includes a compressor 10 and decompressor pair 20 as shown in FIG. 1. The compressor 10 preprocesses melody data and generates the corresponding compressed data for storage in a storage device 30 or for transmission through a communication channel 40. The decompressor 20 obtains the compressed data from the storage device 30 or through the communication channel 40, and decompresses the compressed data to its original melody data.

According to the preferred embodiment of the present invention, both the compressor 10 and decompressor 20 maintain their own dictionary in the form of a first-in-first-out sliding window with the same structure and size. The compressor 10 generates commands on the compressed data to instruct the decompressor 20 whether or not to shift a newly decoded musical note into the dictionary. This ensures that both dictionaries work synchronously and the data inside the dictionaries are always identical.

Figure 2:
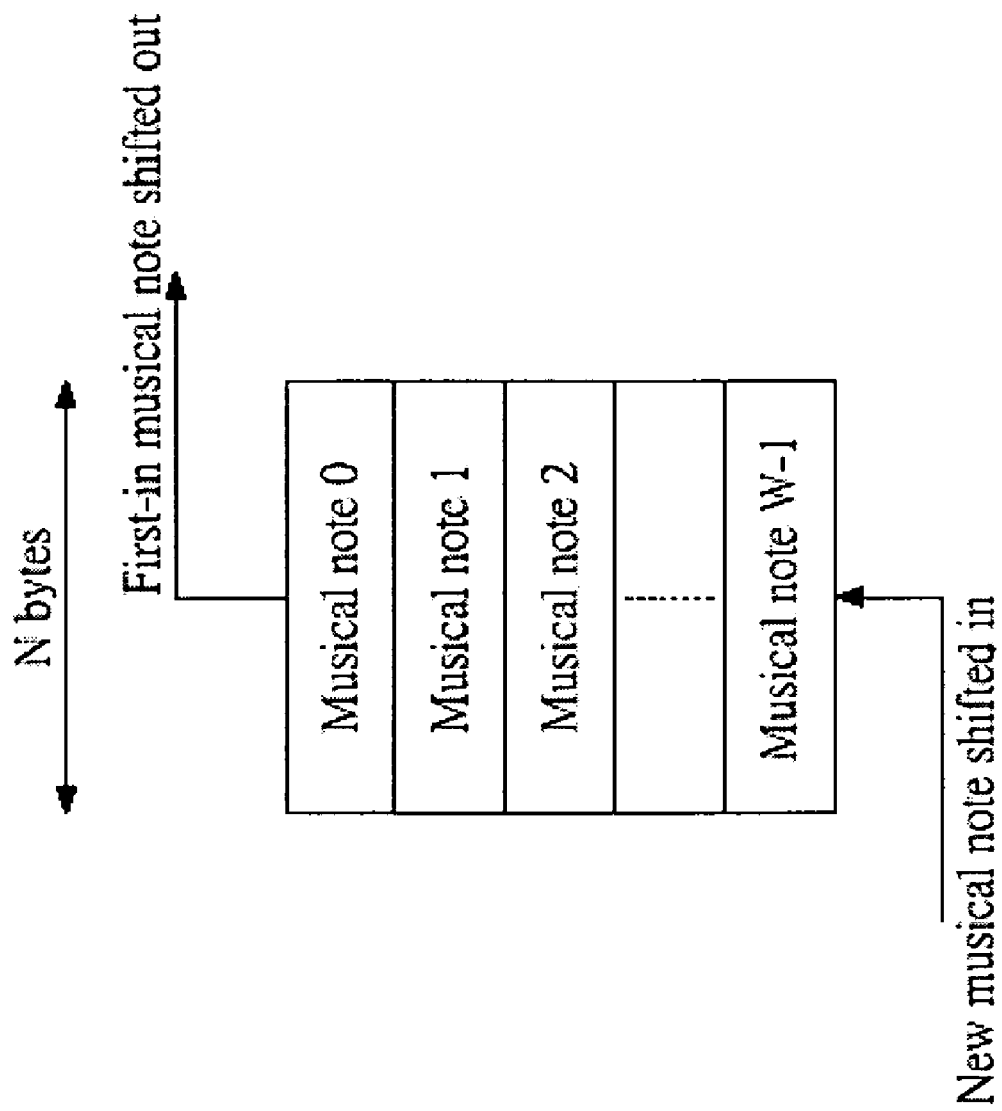
FIG. 2 shows a structure of an exemplary dictionary according to a preferred embodiment of the present invention.

FIG. 2 shows an exemplary structure of the dictionary in which each musical note occupies N bytes and the dictionary accommodates maximum W musical notes. In one aspect, the dictionary can be in the form of a simple sliding window. The index to the dictionary entry contains w bits where w=log 2(W). The dictionary size W is preferably an integer power of 2 to fully utilize the combinations of w bits of the index. In another aspect, it is agreed by both the compressor and decompressor that the dictionary is zero-initialized before encoding and decoding the first musical note respectively.

The present invention provides a data format for compressed melody data. The data format for the compressed melody data is in a command-data pair. The command part in the compressed melody data is used to index a dictionary entry (hereinafter, indexed dictionary entry), which is closest to a current musical note in decompressed format. Moreover, the command part in the compressed melody data also indicates whether the indexed dictionary entry needs modification to obtain a decoded musical note and whether a newly decoded musical note should be shifted into the dictionary as a new entry. The data part in the compressed melody data indicates how the indexed dictionary entry should be modified when the command part confirms the modification. More particularly, the data part includes a first data field to indicate a modification setting for the indexed dictionary entry to be modified. The first data field elements includes a series of binary bits to indicate whether data portions in the indexed dictionary entry need modification. The data part further includes a second data field to store data segments used for replacing corresponding data portions in the indexed dictionary entry.

Figure 3:
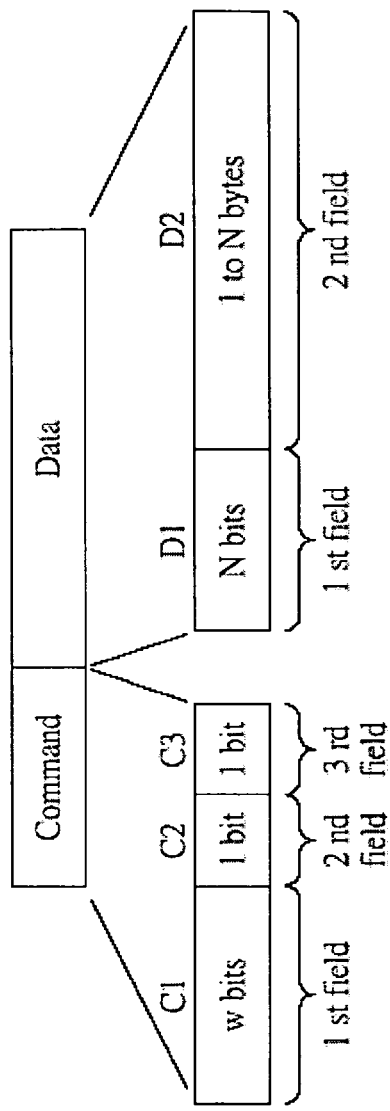
FIG. 3 shows a musical note coded into a command-data pair in the compressed data according to a preferred embodiment of the present invention.

FIG. 3 shows the format of the compressed melody data in the command-data pair, according to a preferred embodiment of the present invention. The command part is compulsory, while the data part may be absent for the specific command. The command part consists of 3 bit fields. The first command field C1 in the command part is of w bits long and it is the index to entries of the dictionary. The second command field C2 in the command part contains 1 bit specifying the operation to be done on the indexed dictionary entry to obtain a newly decoded musical note. For example, if the command field C2 has a value of 1, then the decoded musical note is obtained by modifying the indexed dictionary entry. In this case, the data part is used to specify how the modification should be made. If this second command field C2 has a value of 0, then the decoded musical note is obtained by copying the indexed dictionary entry designated by the first command field C1 from the dictionary without modification. In this case, the data part is absent.

If the second command field C2 carries the value of 1, then the third command field C3 in the command part contains 1 bit specifying whether the decoded musical note has to be shifted into the sliding window, namely, the dictionary. If the second field C2 has the value of 0, then the third field C3 is absent. Because the identical musical note has been found in the window, the decoded musical note must not be shifted into the dictionary to avoid duplicated data in the window.

The data part is present only if the second command field C2 of the command part is 1. The data part indicates to the decompressor how the indexed dictionary entry taken from the dictionary is modified to obtain the decoded musical note. According to a preferred embodiment of the present invention, the data part consists of 2 bit fields.

The first field D1 of the data part contains N bits. Each bit corresponds to a data byte in a musical note of N bytes. If a binary bit in the first field D1 has a value of 1, the corresponding byte in the indexed dictionary entry taken from the dictionary is then modified. If a binary bit in the first field D1 has a value of 0, the corresponding data byte in the indexed dictionary entry taken from the dictionary remains unchanged.

Figure 7:
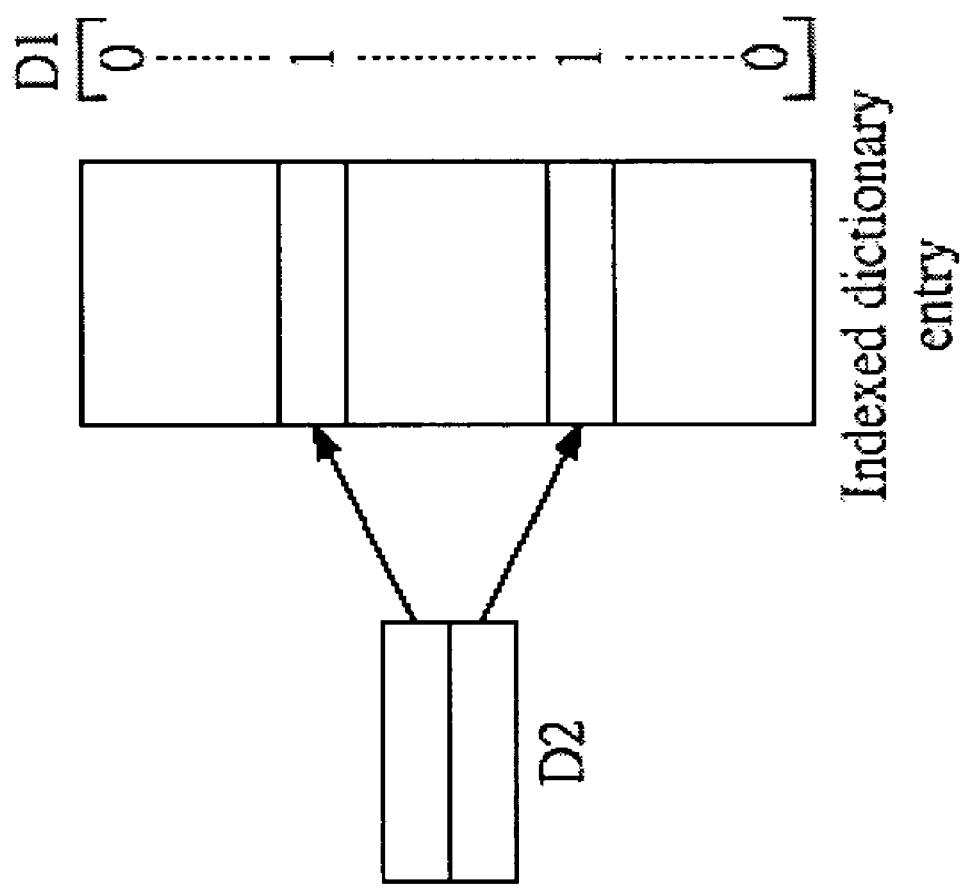
FIG. 7 is a schematic diagram showing how an indexed dictionary entry is modified.

The second data field D2 of the data part consists of 1 to N bytes depending on the number of binary ones in the first data field D1 of the data part. Each of data bytes in the second data field D2 is used to replace a data byte in the indexed dictionary entry, which is designated by a corresponding binary one in the first data field D1. FIG. 7 is a schematic diagram showing how the indexed dictionary entry is modified. In this figure, the first data field D1 is an n-tuple vector with two binary ones and (n-2) binary zeros. Therefore, the second data field D2 contains two data bytes (data segments) to replace corresponding data bytes (data portions) in the indexed dictionary entry, which are designated by the first data field D1.

The above description for the format of the compressed melody data is based on the condition that each musical note occupies N bytes and the dictionary accommodates maximum W musical notes. However, the detailed format of the compressed melody data can be modified according to practical need. The command part of the compressed melody data can use another binary value, such as binary 0, to confirm the modification of the indexed dictionary entry. Therefore, the above description is not a limitation to the scope of the present invention.

Figure 4:
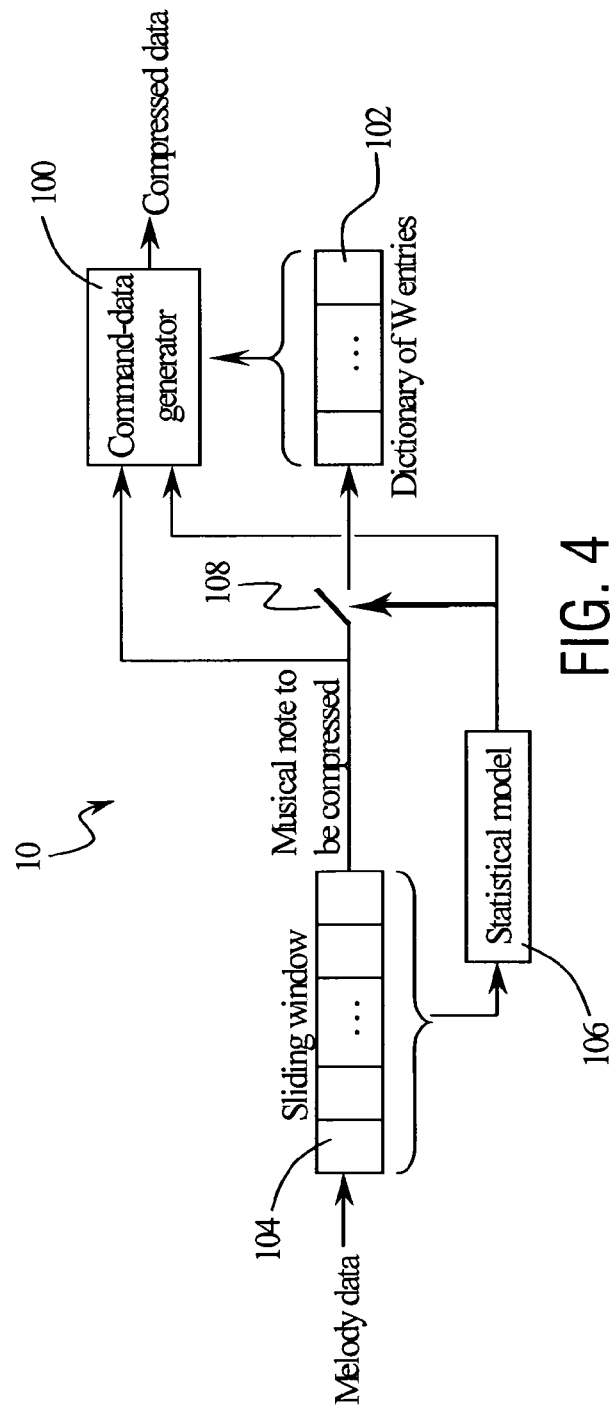
FIG. 4 shows a block diagram of the compressor according to a preferred embodiment of the present invention.

An exemplary block diagram of the compressor 10 is shown in FIG. 4. As shown in this figure, the compressor 10 includes a command-data generator 100, a dictionary 102 of W entries, a statistical model 106, and at least one sliding window 104. The compressor 10 compresses a melody data of a plurality of musical notes into a compressed data with reference to the statistical model 106. The compressed data has a format shown in FIG. 3. The melody data to be compressed in the form of a train of musical notes are sequentially shifted into sliding window 104 for evaluation using the statistical model 106. The window size is adjustable in order to attain the best compression ratio. The statistical model 106 determines whether a musical note to be compressed located at the end of sliding window 104 should be shifted into the dictionary 102. When a musical note has a statistical significance according to the statistical model 106, the switch 108 closes to allow the musical note to be shifted into the dictionary 102. Otherwise, the switch 108 is open to keep the dictionary 102 unchanged. In the statistical model 106, the musical note to be compressed is firstly assumed to be shifted into the dictionary 102 to form an imaginary dictionary. Then the following musical notes in the sliding window 104 are encoded using the imaginary dictionary as if what is done in the command-data generator 100. The number of times the musical note to be compressed in the imaginary dictionary is referenced during the encoding process is recorded, while the encoding results are discarded. Statistical significance of the musical note to be compressed is deemed present when the resemblance of the musical note to be compressed reaches a threshold condition. In particular, if the number of times the musical note is referenced is above a predefined threshold value, it is deemed to have statistical significance and the musical note is deemed useful and is shifted into the dictionary 102. In other words, if the musical note to be compressed if found to resemble (as indicated by the musical note being referenced during encoding of notes) a predefined number of musical notes from sliding window 104, the musical note is shifted into dictionary 102.

Before the musical note is shifted into the dictionary 102 (to the extent that it is needed), the command-data generator 100 references the dictionary entries and codes the musical note into a command-data pair as compressed data. The referenced dictionary entry must be the closest to the musical note for the best compression ratio. The command-data generator 100 records an index in the first command field C1 of the compressed data such that the referenced dictionary entry is an indexed dictionary entry designated by the first command field C1. When a difference is present between the musical note and the indexed dictionary entry, the command-data generator 100 stores an indication in the second field C2 of the compressed data to indicate a modification requirement. Moreover, the command-data generator 100 stores the difference between the musical note and the referenced dictionary entry in the data part of the compressed data. When the musical note is needed to shift into the dictionary 102, in accordance with the statistical model 106, the command-data generator 100 makes an indication in the third command field C3 to indicate an update requirement.

Figure 5:
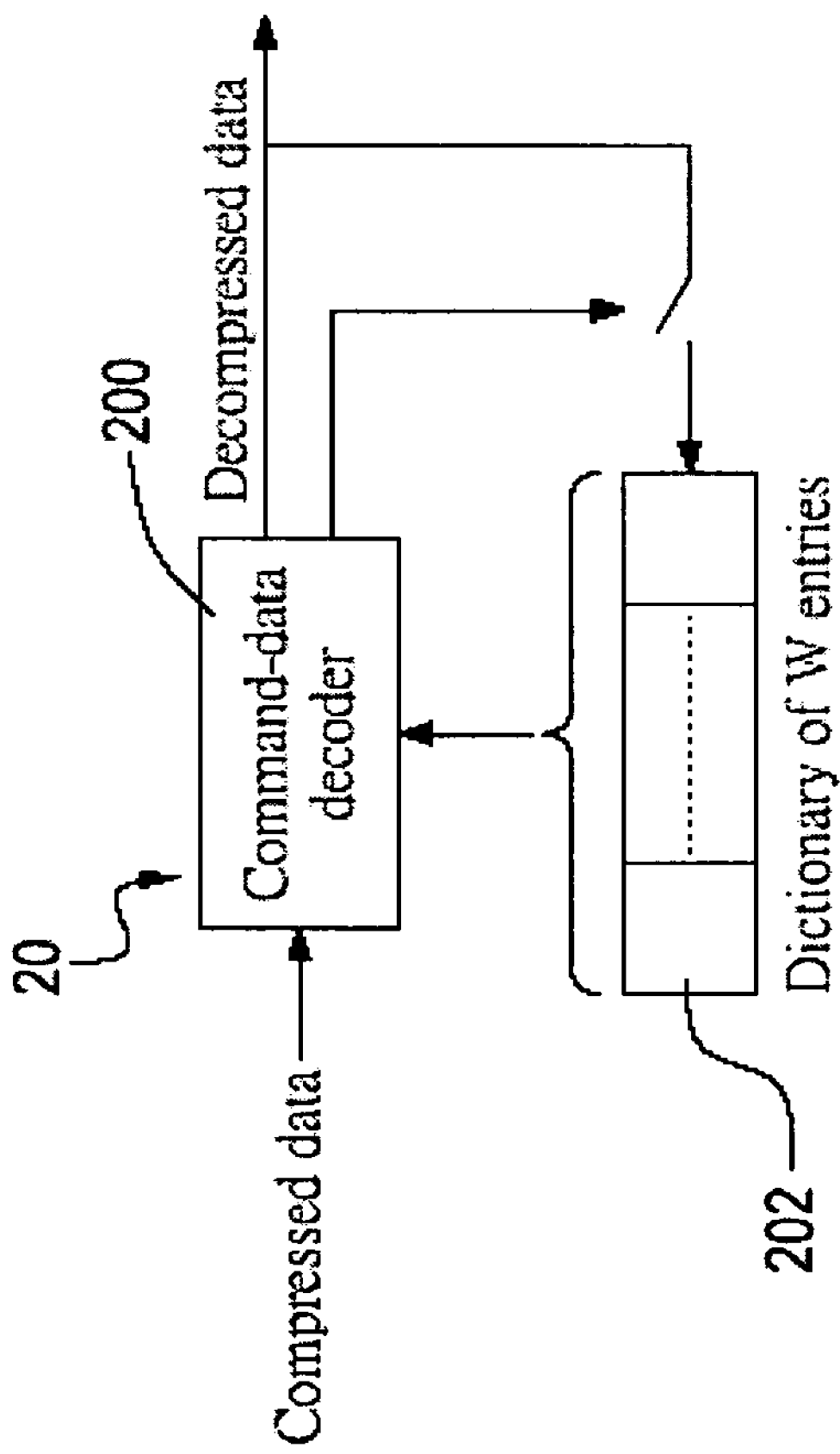
FIG. 5 shows a block diagram of the decompressor according to a preferred embodiment of the present invention.

An exemplary block diagram of the decompressor 20 is shown in FIG. 5. The decompressor 20 decompresses compressed data in the command-data pair format to the original melody data. The decompressor 20 includes a command-data decoder 200 and a dictionary 202 of W entries. The decoder 200 interprets the input command-data pair so as to regenerate musical notes in the original melody data by either copying or modifying the indexed entry from the dictionary 202.

The decoder 200 also allows or disallows the decoded musical note to shift into the dictionary 202 for updating the dictionary 202 according to the instruction provided by the command part of the input data. This updating operation for the dictionary 202 of the decompressor 20 synchronizes the dictionary content with the dictionary 102 in the compressor 10.

Figure 8:
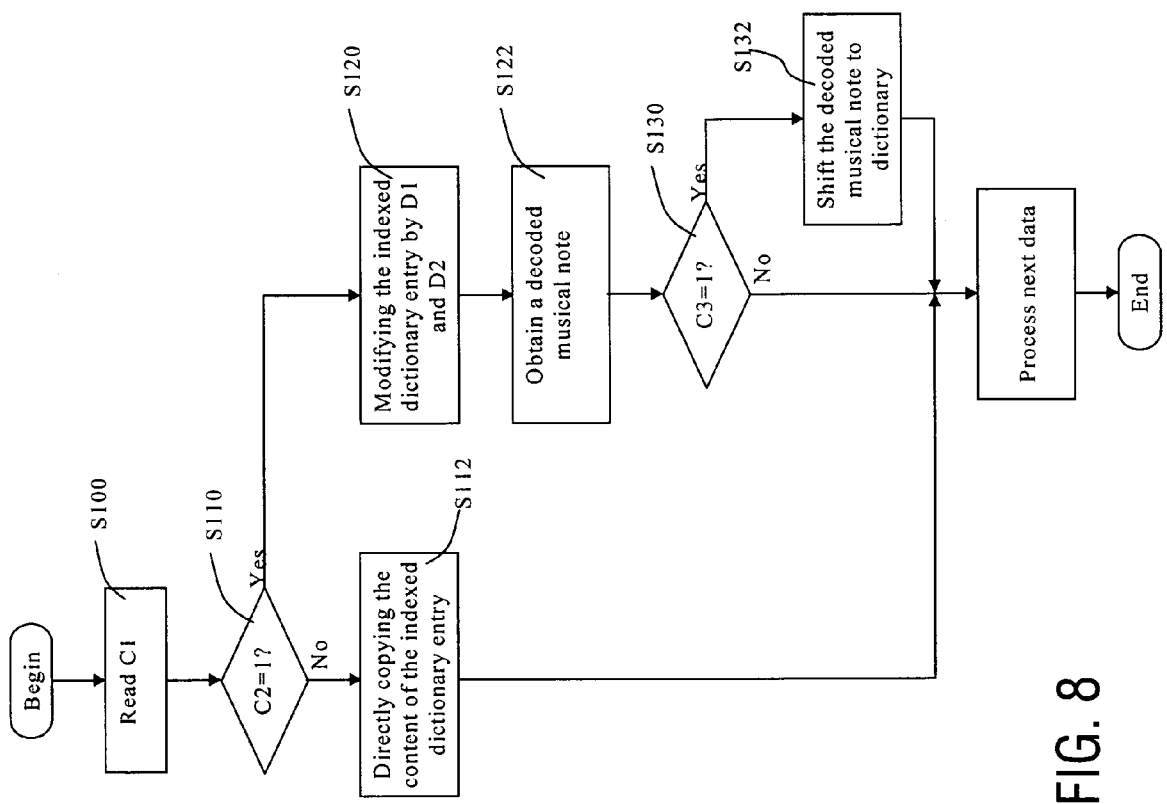
FIG. 8 is a flowchart that shows an exemplary decompressing procedure performed by the decompressor according to a preferred embodiment of the present invention.

The decompression procedure is described with reference to FIGS. 5 and 8. FIG. 8 shows an exemplary decompression procedure performed by the decoder 200, where an input compressed data is processed to obtain a decoded musical note. The decoder 200 also decides, according to the command part of the input compressed data, whether the decoded musical note should be shifted to the dictionary 202 to update the dictionary 202.

With reference to FIG. 8, in step S100, a first command field C1 of the command part is extracted from the input compressed data encoded in command-data pair format. The first command field C1 is used to index a dictionary entry in the dictionary 202. Step S110 examines the second command field C2 in the command part of the input compressed data. When the second field C2 of the command part has a value of 1, the dictionary entry indexed by the first field C1 needs modification for obtaining the decoded musical note, so that step S120 is next performed. Otherwise step S112 is performed, where the decoded musical note is obtained by directly copying the indexed dictionary entry designated by the first field C1 without modification.

In step S120, the indexed dictionary entry is modified with reference to a modifying setting in the first data field D1 of the data part and data segments in the second data field D2 of the data part. More particularly, if an element in the first field D1 has a value of 1, the corresponding data portion in the indexed dictionary entry is modified by the data segment in the second data field D2, which is designated by the element in first field D1 of the data part, as illustrated, for example, in FIG. 7.

In other words, each binary 1 present in field D1, which indicates a corresponding byte in the indexed dictionary, is used to designate a corresponding byte of data in field D2, which is substituted for the corresponding byte in the indexed dictionary to create a modified indexed dictionary entry.

In step S122, the decoded musical note is obtained. Step S130 examines whether the third command field C3 has a value of 1. If the third command field C3 has a value of 1, step S132 is performed to shift the decoded music note into the dictionary 202 as a new entry in the dictionary 202. Otherwise, the process moves directly to the processing the next data.

To evaluate the performance of the present invention, twelve melodies were selected randomly and compressed by LZ77, PowerArchiver 6.11, and an embodiment of this invention (SLZ) of different dictionary sizes. Each musical note in the melody files contained 4 bytes. The LZ77 scheme used a search window of 64 bytes and a look-ahead window of 8 bytes. The LZ77 decompressor required the same amount of RAM as SLZ (W=16). Comparisons of the three schemes are shown in FIG. 6. All file sizes are in bytes. PowerArchiver has best performance for melodies 3, 8, 9, and 12. SLZ with dictionary size of 4 (W=4) has best performance for melody 4. SLZ with dictionary size of 8 (W=8) has best performance for melody 7. SLZ with dictionary size of 16 (W=16) has best performance for melodies 1, 2, 5, 6, 10 and 11. SLZ with dictionary sizes of 8 and 16 outperformed LZ77 in compression ratio. The decompressor of SLZ (W=8) required less RAM than LZ77 did for even better compression ratio. Although PowerArchiver won in a few cases, it used multiple schemes of entropy coding and run-length coding in addition to LZ77. The decompressor required much more processing power than purely SLZ did. In fact, SLZ showed the best performance in overall compression ratio.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A data compressor for compressing melody data to compressed data, comprising:
    a command-data generator;
    a dictionary having a first plurality of dictionary entries;
    a sliding window used to gather a plurality of input musical notes in the melody data;
    a statistical model operable to compare the musical note to be compressed with subsequent musical notes in the sliding window; and
    a switch that is configured to toggle from an open to a closed position in order to selectively place an input musical note to be compressed into the dictionary when the input musical note has a significance according to the statistical model,
    the command-data generator being configured to communicate with the sliding window, the statistical model, and the dictionary to output the compressed data.

2. The data compressor of claim 1, wherein the compressed data. comprises a command part and a data part.

3. The data compressor of claim 2, wherein the command-data generator is configured to find a dictionary entry closest to the musical note to be compressed and configured to store an index for the dictionary entry in the command part.

4. The data compressor of claim 3, wherein the command-data generator is configured to record a difference between the musical note and the dictionary entry in the data part.

5. The data compressor of claim 4, wherein the command-data generator is configured to store an indicator of update in the command part to indicate whether the dictionary needs updating.

6. The data compressor of claim 1, wherein the number of dictionary entries is an integer power of two.

7. The data compressor of claim 1, wherein the dictionary comprises a first-in-first-out sliding window.

8. A dictionary-based method for compressing melody data into compressed data having a command part and a data part, the method comprising:
    placing a plurality of musical notes from the melody data in a sliding window;
    comparing a first musical note received from the sliding window to a plurality of following notes received from the sliding window to determine a statistical significance of the first musical note according to a statistical model;
    placing the first musical note received from the sliding window in a dictionary as a dictionary entry when the musical note has statistical significance according to the model; and
    storing an index for the dictionary entry in the command part.

9. The dictionary-based method of claim 8, further comprising:
    finding a difference between a musical note and an existing dictionary entry in the dictionary; and
    storing the difference in the data part of the compressed data.

10. The dictionary-based method of claim 8, further comprising placing an update indicator in the command part when the musical note is determined to have statistical significance.

11. A data decompressor for decompressing compressed data into melody data, wherein the compressed data comprises an index for designating an indexed dictionary entry in a dictionary, a first indicator for indicating whether modification of the indexed dictionary entry is required, a second indicator for indicating whether an update of the dictionary is required, a data part for modifying the indexed dictionary entry, the data decompressor comprising:
    a dictionary with a first plurality of dictionary entries; and
    a decoder configured to select the indexed dictionary entry from the dictionary according to the index in the compressed data, and further configured to output melody data based on the indexed dictionary entry.

12. The data decompressor of claim 11, wherein the decoder is configured to modify the indexed dictionary entry into a decoded musical note when the first indicator shows that modification is required.

13. The data decompressor of claim 12, wherein the decoder is configured to modify the indexed dictionary entry according to the data part in the compressed data.

14. The data decompressor of claim 13, wherein the decoder is configured to update the dictionary by the decoded musical note when the second indicator indicates that the update is required.

15. The data decompressor of claim 11, wherein the number of dictionary entries is an integer power of two.

16. The data decompressor of claim 11, wherein the dictionary comprises a first-in-first-out sliding window.

17. A data decompressing method for decompressing compressed data into melody data, wherein the compressed data comprises an index for designating an indexed dictionary entry in a dictionary, a first indicator for indicating a modification of indexed dictionary entry, a second indicator for indicating an update of the dictionary, a data pan for modifying the indexed dictionary entry, the data decompressing method comprising:
    reading compressed data;
    finding an indexed dictionary entry in the dictionary according to the index; and
    using the indexed dictionary entry as a decoded musical note when the first indicator indicates that no modification is needed.

18. The data decompressing method of claim 17, further comprising:
    modifying the indexed dictionary entry by the data pan to obtain a decoded musical note when the first indicator indicates that a modification is needed.

19. The data decompressing method of claim 18, further comprising:

placing the decoded musical note in the dictionary when the second indicator indicates that an update of the dictionary is needed.

20. A dictionary-based system for compressing melody data, comprising:

a computer-readable medium storing a data structure, the data structure representing the melody data in a compressed form, the data structure having a command part comprising an index to designate an indexed dictionary entry in a dictionary and a first indicator that is configured to specify an operation to be performed on the indexed dictionary entry.

21. The system of claim 20, wherein the command part further comprises a second indicator configured to indicate whether the dictionary needs to be updated with a decoded musical note based on the indexed dictionary entry.

22. The system of claim 20, the data structure further comprising a data part arranged to be used to modify the indexed dictionary entry when the first indicator shows that a modification for the indexed dictionary entry is required.

23. The system of claim 22, wherein the data part comprises a first data field for storing a modification setting for the indexed dictionary entry and a second data field for storing at least one data segment, wherein a decoded note comprises a data segment of the second data filed substituted for a portion of the indexed dictionary entry designated by the first data field.

24. The system of claim 23, wherein the dictionary is configured to receive the decoded musical note when the second indicator shows that an update of the dictionary is needed.

25. The system of claim 24, wherein when an element in the first data field has a binary value of 1, a corresponding data portion of the indexed dictionary entry is configured to be replaced by a data segment of the second data field which is designated by the element.

26. The system of claim 25, wherein when an element in the first data field has a binary value of 0, a corresponding portion of the indexed dictionary entry remains unchanged.

* * * * *